United States Patent
Chung et al.

[11] Patent Number: 5,838,162
[45] Date of Patent: Nov. 17, 1998

[54] TEST APPARATUS AND METHOD FOR TESTING INTEGRATED CIRCUIT MODULES HAVING VISUAL DISPLAY

[75] Inventors: Wen-Szu Chung, Hsinchu; Wei-Kay Chiu, Pao-Shan-Hriang, both of Taiwan

[73] Assignee: Taiwan Semiconductor Manufacturing Company Ltd., Hsin-Chu, Taiwan

[21] Appl. No.: 663,578

[22] Filed: Jun. 13, 1996

[51] Int. Cl.⁶ .................................................. G01R 31/02
[52] U.S. Cl. .......................................................... 324/755
[58] Field of Search ................................... 324/755, 754, 324/761, 762; 439/66–70

[56] References Cited

U.S. PATENT DOCUMENTS

5,086,270  2/1992  Karasawa et al. ...................... 324/755
5,281,163  1/1994  Knox et al. .
5,456,608  10/1995  Rogers et al. .
5,575,686  11/1996  Noschese ................................ 439/620

Primary Examiner—Ernest F. Karlsen
Assistant Examiner—Anh Phung
Attorney, Agent, or Firm—George O. Saile; Stephen B. Ackerman; Larry J. Prescott

[57] ABSTRACT

A test apparatus and method for testing integrated circuit modules permitting visual observation of both top and bottom of the module under test. The test apparatus uses a first circuit board and a second circuit board interconnected by means of cables between cable sockets attached to each circuit board. The first circuit board has a display opening. An integrated circuit socket having a center opening is attached to the first circuit board so that the center opening of the integrated circuit socket is directly over the display opening of the first circuit board. Input connectors and jumper sockets attached to the second circuit board permit electrical signals to be connected to the integrated circuit socket contacts. Integrated circuit modules inserted into the integrated circuit socket can be visually observed directly or through the display opening in the first circuit board.

19 Claims, 6 Drawing Sheets

TEST APPARATUS AND METHOD FOR TESTING INTEGRATED CIRCUIT MODULES HAVING VISUAL DISPLAY

BACKGROUND OF THE INVENTION

(1) Field of the Invention

This invention relates to a method and apparatus used for testing integrated circuit modules having a visual display. More particularly the invention relates to a first circuit board, having a display opening and an integrated circuit socket, interconnected to a second circuit board by means of interconnecting cables. Electrical signals to the integrated circuit socket are distributed by means of the second circuit board interconnected to the first circuit board.

(2) Description of the Related Art

U.S. Pat. No. 5,456,608 to Rogers et al. describes a switching matrix where conductive traces on a circuit board can be connected to conductive traces on a parallel circuit board using a non conductive pin with a conductive coating inserted through contact holes in the circuit boards.

U.S. Pat. No. 5,281,163 to Knox et al. describes a modular interconnection system for telecommunication wires.

The invention of this Patent Application describes a test apparatus for connecting electrical signals to an integrated circuit socket. The integrated circuit socket is attached to a circuit board having a display opening permitting visual observation of both the top and bottom of an integrated circuit module under test.

SUMMARY OF THE INVENTION

In the testing of integrated circuit modules it is necessary to apply different electrical signals to different connection points of the integrated circuit. If the integrated circuit modules display visual information, such as an emission microscope hot spot it is often necessary to be able to observe visually both the top and bottom surfaces of the integrated circuit module under test. It is also important to provide flexibility in connecting different electrical signals to different connection points of the integrated circuit.

It is an objective of this invention to provide a test apparatus for testing integrated circuit modules which permits electrical signals to be connected to any electrical connection point of an integrated circuit module and which allows visual observation of both the top and bottom surfaces of the integrated circuit module.

It is a further objective of this invention to provide a method of testing integrated circuit modules which permits electrical signals to be connected to any electrical connection point of an integrated circuit module and which allows visual observation of both the top and bottom surfaces of the integrated circuit module.

These objectives are achieved by using a first and a second circuit board, each circuit board having multilevel wiring. The first circuit board has a display opening in the circuit board and an integrated circuit socket having a center opening attached over the display opening so that the center opening of the integrated circuit socket is directly over the display opening in the first circuit board. A number of cable sockets are also attached to the first circuit board with one of the cable socket contacts electrically connected to each of the integrated circuit contacts. The integrated circuit module to be tested is inserted in the integrated circuit socket with the bottom surface of the integrated circuit module directly over the display opening of the first circuit board so that both the top and bottom surfaces of the integrated circuit module can be observed visually.

The second circuit board has a number of cable sockets and jumper sockets attached. The cable socket connectors are electrically connected to jumper socket connectors. Cables, such as a ribbon cable, are used to connect cable sockets on the first circuit board to cable sockets on the second circuit board. Jumper socket contacts are connected to electrical signal input connectors which are connected to electrical signal sources. Jumpers are used to direct the electrical signals, from the electrical signal sources, from the jumper socket contacts to the appropriate cable socket contact on the second circuit board. In this way the electrical signal sources can be connected to the appropriate integrated circuit socket contact with complete flexibility. As the electrical signals are applied, both the top and bottom surfaces of the integrated circuit module can be observed visually and operation of display units, such as an emission microscope hot spot, can be monitored.

DESCRIPTION OF THE PREFERRED EMBODIMENTS

Figure 1:
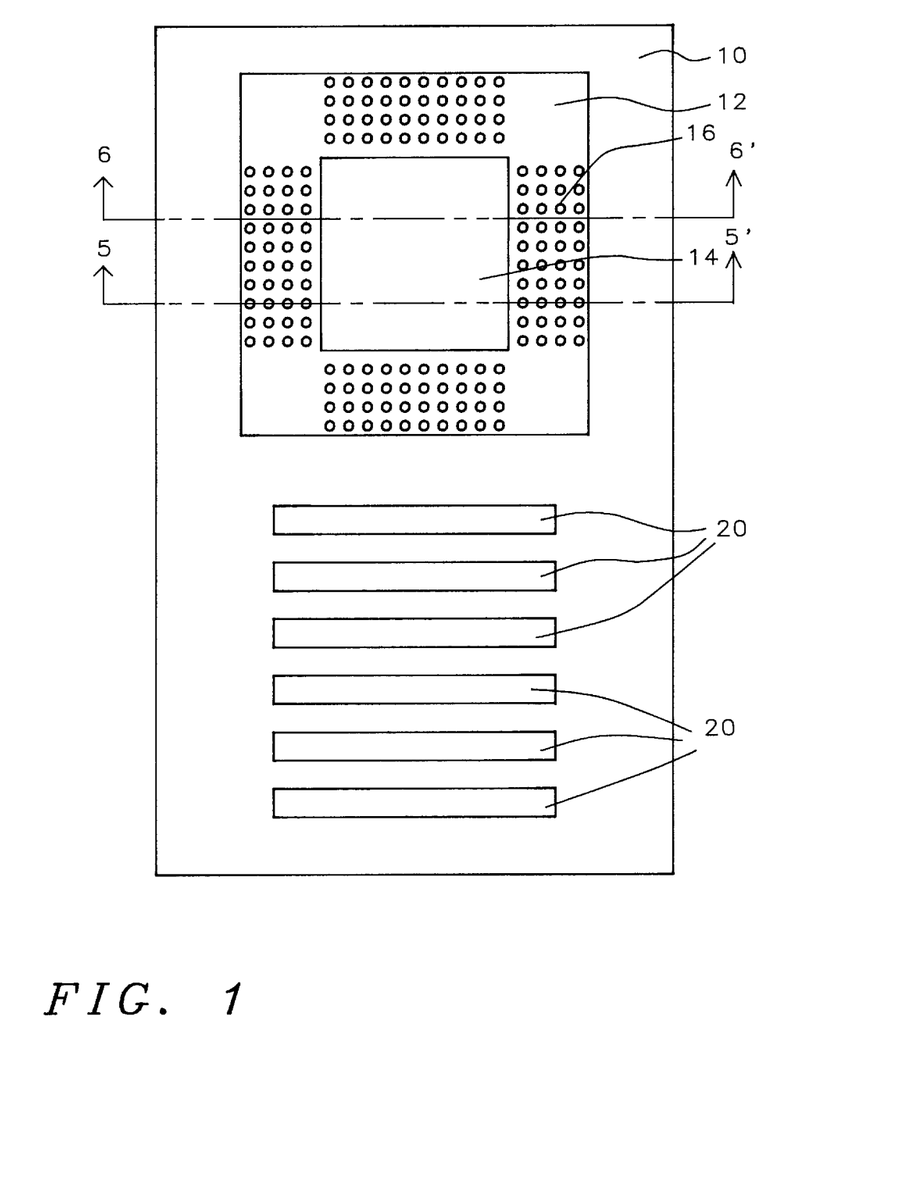
FIG. 1 shows a top view of the first circuit board.

Refer now to FIGS. 1–7 there is shown an embodiment of the test apparatus of this invention. FIG. 1 shows a top view of a first circuit board 10 having multilevel wiring. The first circuit board 10 has a display opening 14 where all the circuit board material has been removed. An integrated circuit socket 12 having a number of integrated circuit contacts 16, in this example 160, is attached to the first circuit board 10. The integrated circuit socket has a center opening and is attached to the first circuit board 10 so that the center opening of the integrated circuit socket is directly over the first circuit board display opening 14. The integrated circuit contacts 16 are located around the periphery of the center opening.

Figure 3:
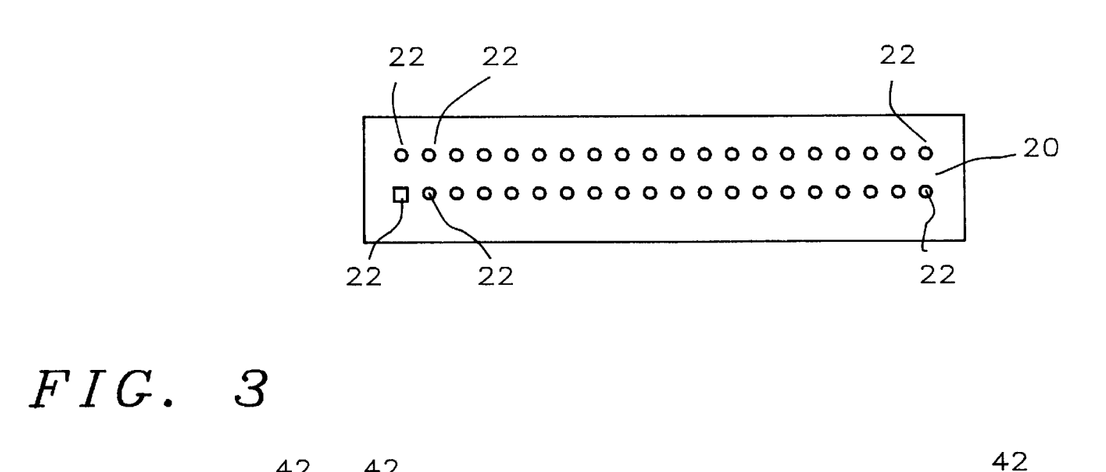
FIG. 3 shows a detailed view of one of the cable sockets.

A number of cable sockets 20, in this example 6, are attached to the first circuit board. Refer now to FIG. 3, there is shown a detailed view of the cable socket 20. The cable socket 20 has a number of cable contacts 22, in this example 40, arranged in rows. Each of the cable contacts 22 of the cable sockets attached to the first circuit board are electrically connected to one of the integrated circuit contacts 16 through the wiring of the first circuit board.

Figure 5:
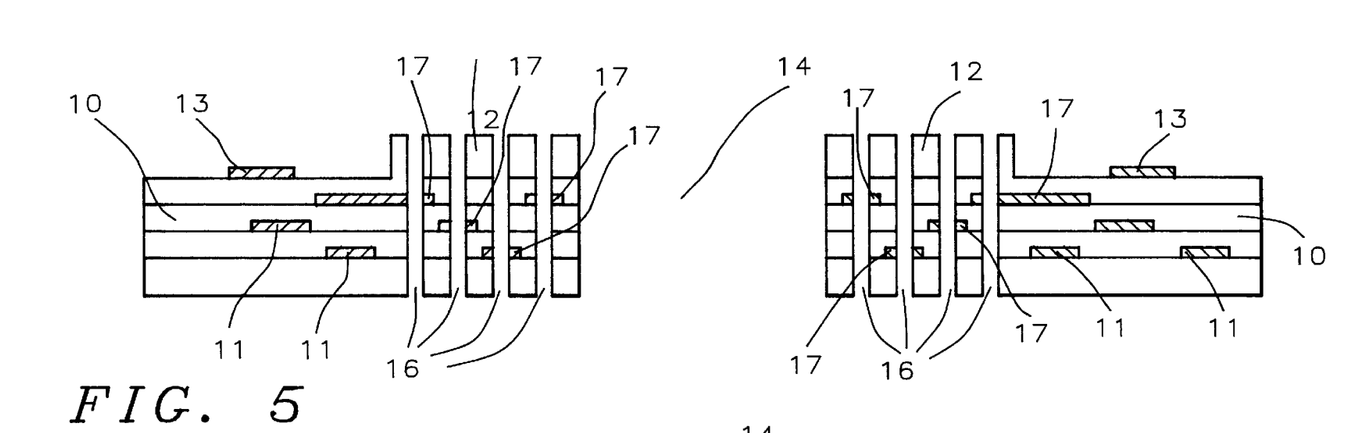
FIG. 5 shows a cross section view of the first circuit board along line 5–5' of FIG. 1.
Figure 6:
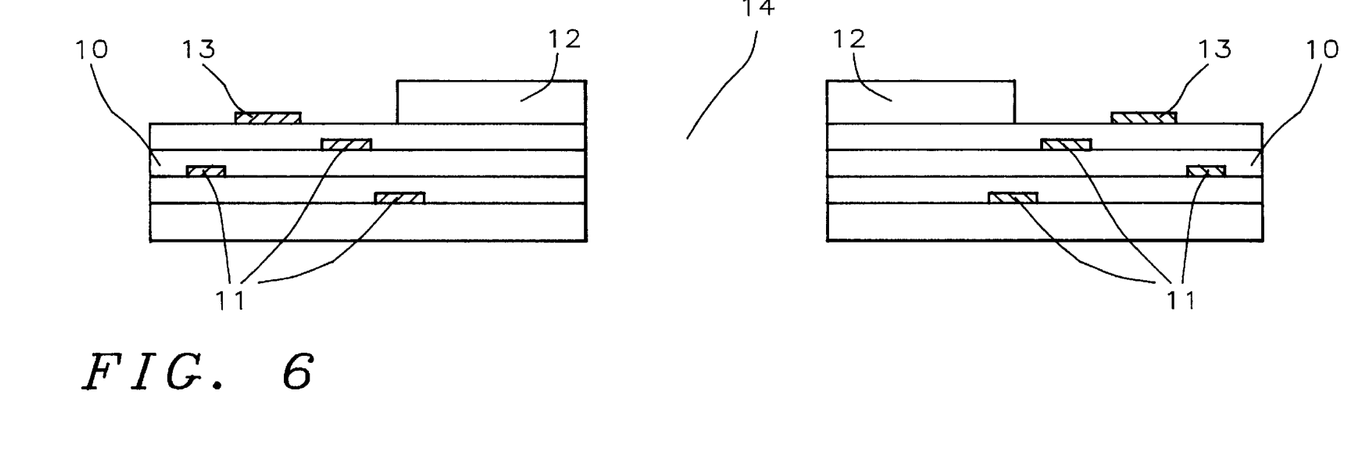
FIG. 6 shows a cross section view of the first circuit board along line 6–6' of FIG. 1.

Refer now to FIG. 5, there is shown a cross section of the first circuit board 10 along line 5–5' of FIG. 1. The display opening 14 of the first circuit board 10 is shown in FIG. 5. The first circuit board 10 has a number of levels, in this example 3, of buried wiring 11 as well as wiring 13 on the top surface of the circuit board. As can be seen in FIG. 5, electrical contact 17 is formed between the circuit board wiring and the integrated circuit contacts 16 of the integrated circuit socket 12. FIG. 6 shows a cross section of the first circuit board 10 along the line 6–6' of FIG. 1 showing the surface wiring 13 of the first circuit board, the buried wiring 11, of the first circuit board, the display opening 14 of the first circuit board, and the center opening in the integrated circuit socket 12.

Figure 2:
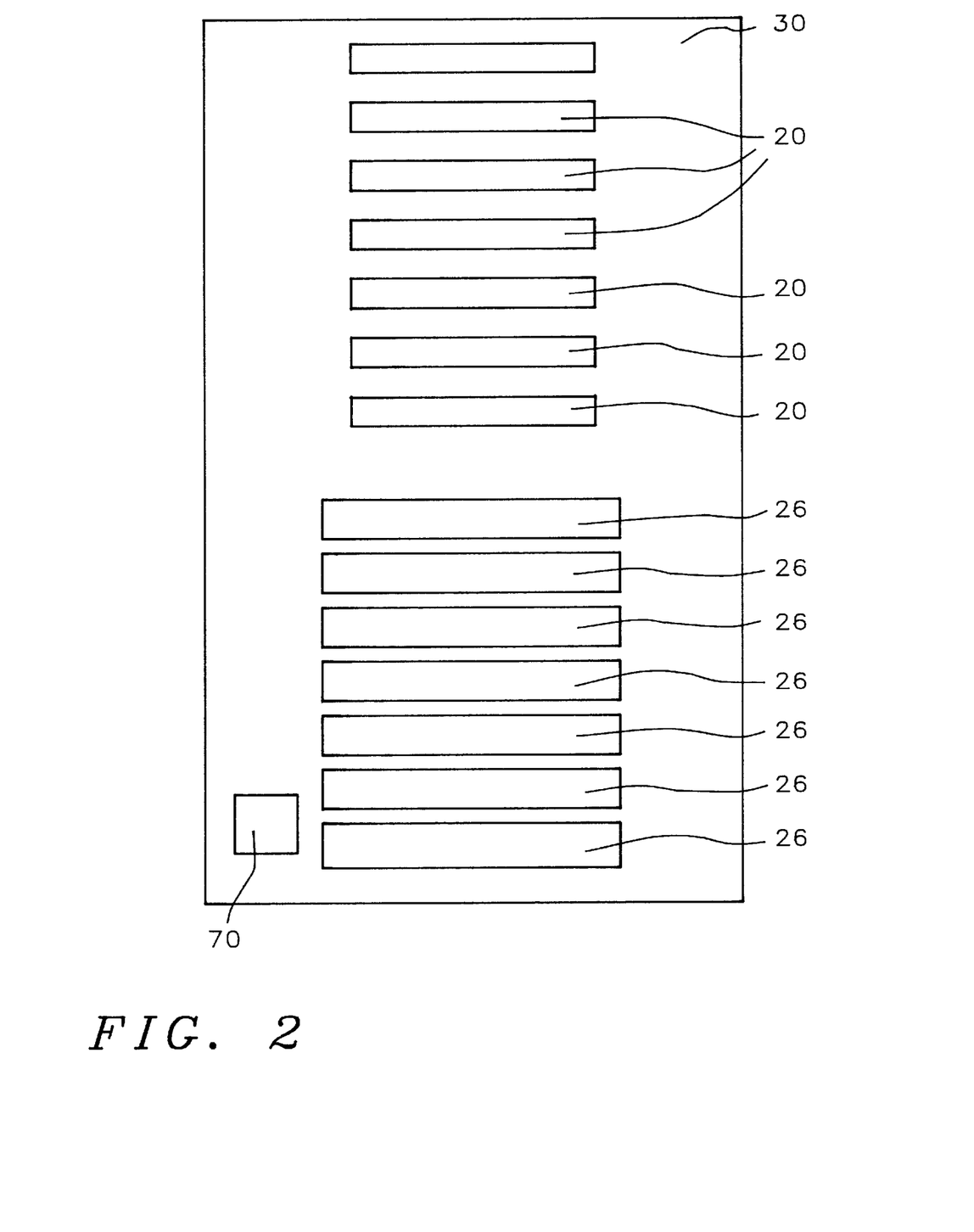
FIG. 2 shows a top view of the second circuit board.

Refer now to FIG. 2, there is shown a second circuit board 30 having multilevel wiring. A number, in this example 7, of cable sockets 20 and a number, in this example 7, of jumper sockets 26 are attached to the second circuit board 30. The detail of the cable sockets is shown in FIG. 3 and in this example is the same as the cable socket used in the first circuit board and described above. Those skilled in the art will recognize that different cable sockets on the first circuit board and the second circuit board could also be used.

Figure 4:
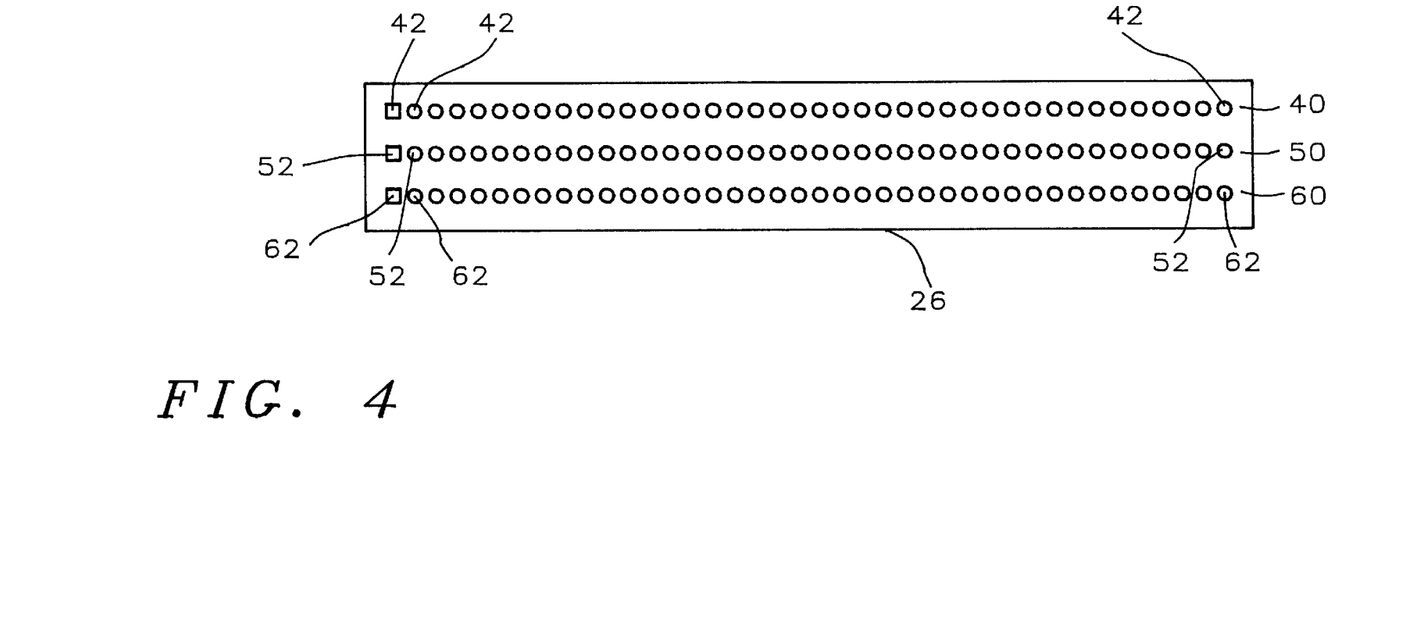
FIG. 4 shows a detailed view of one of the jumper sockets.

As shown in FIG. 2 a number, in this example 7, of jumper sockets 26 are attached to the second circuit board. A detailed view of the jumper socket 26 is shown in FIG. 4. The jumper socket 26 has a number, in this example 40, of first jumper contacts 42 arranged in a first row 40; a number, in this example 40, of second jumper contacts 52 arranged in a second row 50; and a number, in this example 40, of third jumper contacts 62, arranged in a third row 60. The first jumper contacts 42 of each jumper socket 26 are electrically connected to each other using the wiring of the second circuit board. The third jumper contacts 62 of each jumper socket 26 are electrically connected to each other using the wiring of the second circuit board. Each second jumper contact 52 is electrically connected to one of the cable contacts 22 of the cable sockets 20 attached to the second circuit board using the wiring of the second circuit board.

Figure 7:
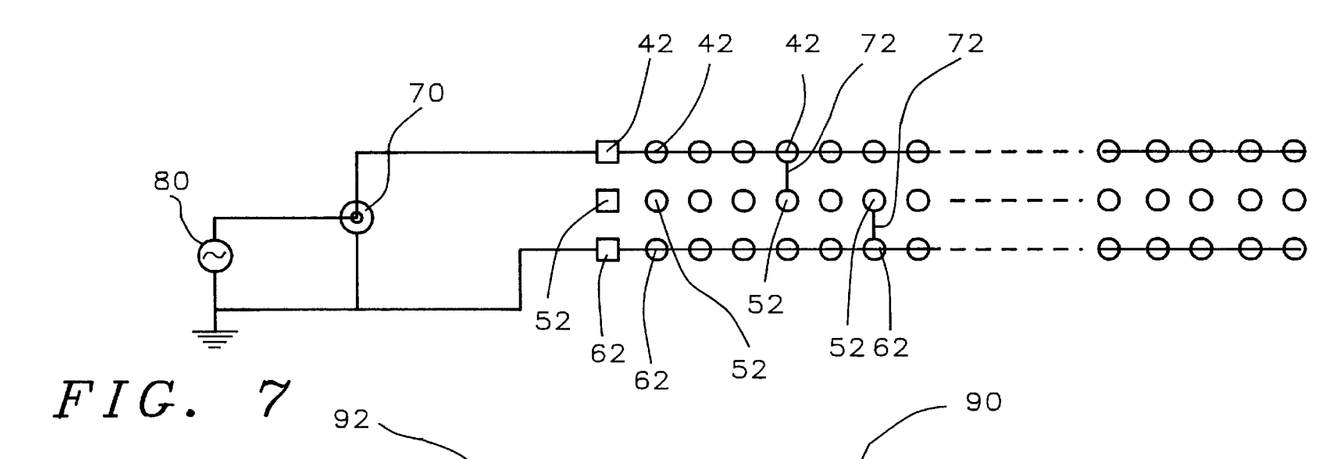
FIG. 7 shows a schematic diagram of the connection of one of the electrical signals to one of the jumper sockets of the second circuit board.

As shown in FIG. 2, a number, in this example 1, of input connectors 70 having two input terminals, such as BNC connectors, are attached to the second circuit board. The input connectors 70 are used to connect electric signals to the test apparatus. FIG. 7 shows a schematic diagram of the connection between the input connectors 70 and the jumper sockets 26. The source 80 of the electrical signal is connected to the two terminals of the input connector 70. One of the terminals of the input connector 70 is connected to the first jumper contacts 42 of one of the jumper sockets 26 using the wiring of the second circuit board. The other terminal of the input connector 70 is connected to the third jumper contacts 62 of one of the same jumper socket also using the wiring of the second circuit board. If more than one input connector is used they are connected in like manner to different jumper sockets. As shown in FIG. 7 jumpers 72 are then used to connect the first jumper contacts 42 to one of the second jumper contacts 52 and the third jumper contacts 62 to another one of the second jumper contacts 52. Although FIG. 7 shows a single jumper socket, the first jumper contacts 42, second jumper contacts 52, and third jumper contacts 62 being electrically connected can all be in different jumper sockets.

Figure 9:
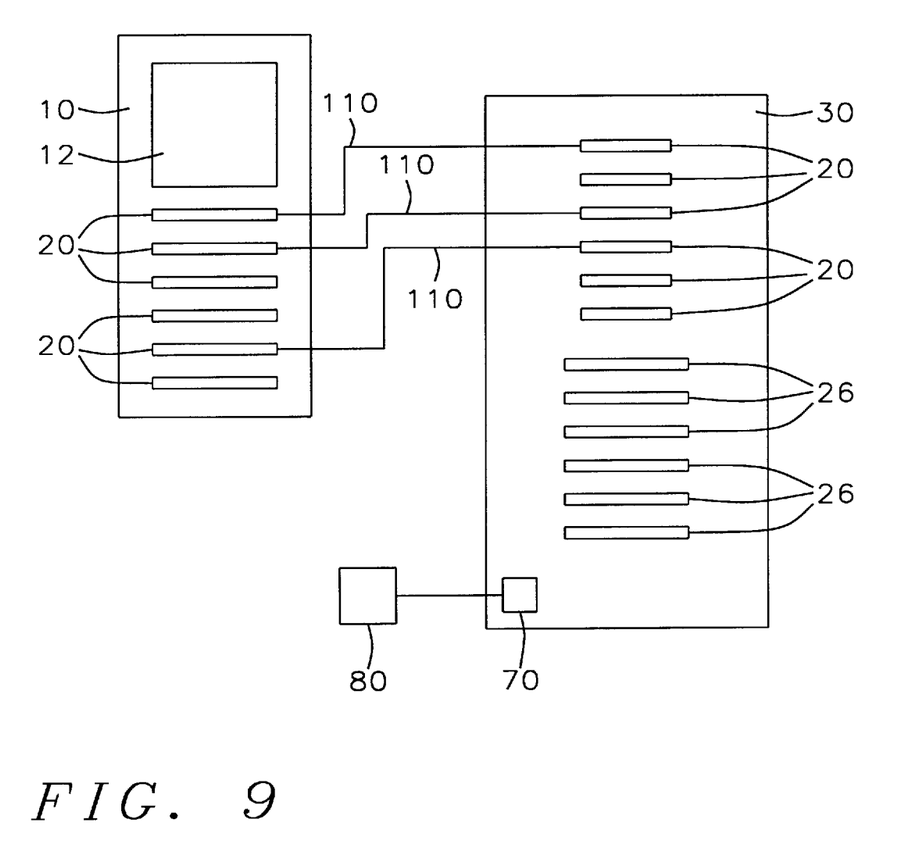
FIG. 9 shows a schematic view of the interconnections between the first circuit board and the second circuit board.

Cables 110, such as ribbon cables, having a first end with a cable connector and a second end with a cable connector are then used to connect selected cable sockets on the first circuit board to selected cable sockets on the second circuit board, shown schematically in FIG 9. In this manner the source 80, or sources, of electric signals can be electrically connected to selected integrated circuit contacts 16 of the integrated circuit socket 12 thereby completing the test apparatus.

Figure 8:
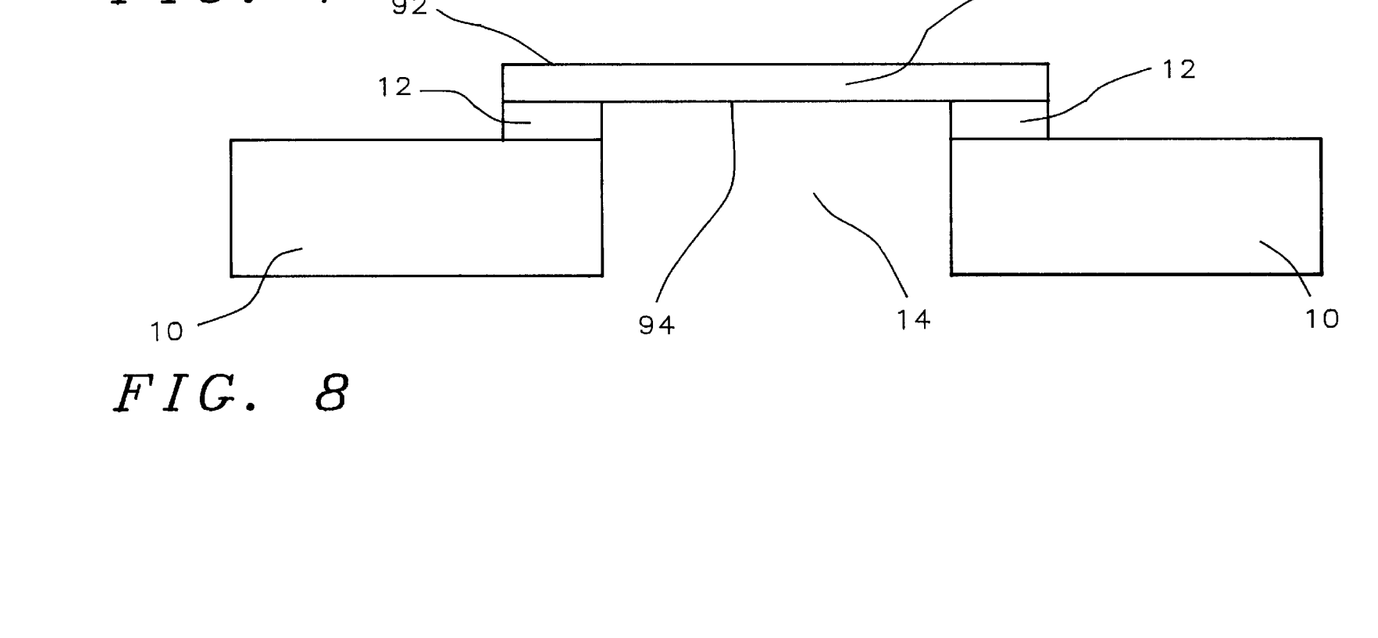
FIG. 8 shows a cross section view of the first circuit board with an integrated circuit module in place.

In addition to previously described FIGS. 1–7, refer now to FIG. 8 for an embodiment of a method of testing integrated circuit modules having a visual display, such as an emission microscope hot spot, in a manner permitting visual observation. This embodiment uses the above described test apparatus of the previous embodiment. As shown in FIG. 8, an integrated circuit module 90 having a top surface 92 and a bottom surface 94 is inserted in the integrated circuit socket 12. Electrical signals are then connected to the integrated circuit contacts of the integrated circuit socket 12 in the manner described in the previous embodiment. The bottom surface 94 of the integrated circuit module 90 can be visually observed through the display opening 14 of the first circuit board 10 and the top surface 92 of the integrated circuit module 90 can be visually observed directly.

While the invention has been particularly shown and described with reference to the preferred embodiments thereof, it will be understood by those skilled in the art that various changes in form and details may be made without departing from the spirit and scope of the invention.

What is claimed is:

1. A test apparatus, comprising:

a first number of first cable sockets wherein each of said first cable sockets has a second number of first cable contacts;

a third number of second cable sockets wherein each of said second cable sockets has fourth number of second cable contacts;

a fifth number of jumper sockets wherein each of said jumper sockets has a sixth number of first jumper contacts, a sixth number of second jumper contacts, and a sixth number of third jumper contacts;

an integrated circuit socket having a seventh number of integrated circuit contacts;

an eighth number of input connectors wherein each said input connector has a first input contact and a second input contact;

a first circuit board having a display opening wherein said first number of first cable sockets are attached to said first circuit board, said integrated circuit socket is attached to said first circuit board at said display opening so that an integrated circuit connected to said integrated circuit socket is directly over said display opening, and each of said integrated circuit contacts is electrically connected to one of said first cable contacts;

a second circuit board wherein said third number of said second cable sockets are attached to said second circuit board, said fifth number of said jumper sockets are attached to said second circuit board, said eighth number of said input connectors are attached to said second circuit board, each of said second jumper contacts is electrically connected to one of said second cable contacts, each of said first jumper contacts in each of said jumper sockets are electrically connected to every other said first jumper contact of the same said jumper socket, each of said third jumper contacts in each of said jumper sockets are electrically connected to every other said third jumper contact of the same said jumper socket, said first input contact of each of said input connectors is electrically connected to said first jumper contacts of one of said jumper sockets, and said second input contact of the same said input connector is electrically connected to said third jumper contacts of the same said jumper socket so that said first input contact and said second input contact of each said input connector are electrically connected to said first jumper contacts and said third jumper contacts of the same said jumper socket;

means to connect said first jumper contacts of each said jumper socket to one of said second jumper contacts of the same said jumper socket;

means to connect said third jumper contacts of each said jumper socket to one of said second jumper contacts of the same said jumper socket; and means to connect each of said second cable contacts to one of said first cable contacts.

2. The test apparatus of claim 1 wherein said first number is between about 4 and 8.

3. The test apparatus of claim 1 wherein said second number, said fourth number, and said sixth number are between about 20 and 60.

4. The test apparatus of claim 1 wherein said third number and said fifth number are between about 5 and 9.

5. The test apparatus of claim 1 wherein said seventh number is between about 68 and 280.

6. The test apparatus of claim 1 wherein said input connectors are BNC connectors.

7. The test apparatus of claim 1 wherein said means to connect each of said second cable contacts to one of said first cable contacts comprises a ribbon cable having a first end, a second end, a first cable connector at said first end, and a second cable connector at said second end.

8. The test apparatus of claim 1 wherein said first circuit board is a multilevel circuit board having a plurality of wiring levels.

9. The test apparatus of claim 1 wherein said second circuit board is a multilevel circuit board having a plurality of wiring levels.

10. The test apparatus of claim 1 wherein said means to connect said first jumper contacts of each said jumper socket to one of said second jumper contacts of the same said jumper socket and said means to connect said third jumper contacts of each said jumper socket to one of said second jumper contacts of the same said jumper socket comprises a jumper cable having a first end, a second end, a first jumper connector at said first end, and a second jumper connector at said second end.

11. A method of testing integrated circuit modules, comprising the steps of:

providing an integrated circuit socket having a center opening and a first number of integrated circuit contacts around the periphery of said center opening;

providing a second number of input connectors wherein each of said input connectors has a first input contact and a second input contact;

providing a third number of electrical signal sources;

providing a fourth number of first cable sockets wherein each of said first cable sockets has a fifth number of first cable contacts;

providing a sixth number of second cable sockets wherein each of said second cable sockets has seventh number of second cable contacts;

providing an eighth number of jumper sockets wherein each of said jumper sockets has a ninth number of first jumper contacts, a ninth number of second jumper contacts, and a ninth number of third jumper contacts;

providing a first circuit board having a display opening wherein said fourth number of first cable sockets are attached to said first circuit board, said integrated circuit socket is attached to said first circuit board at said display opening so that said center opening of said integrated circuit socket is directly over said display opening, and each of said integrated circuit contacts is electrically connected to one of said first cable contacts;

providing a second circuit board wherein said sixth number of said second cable sockets are attached to said second circuit board, said eighth number of said jumper sockets are attached to said second circuit board, said second number of said input connectors are attached to said second circuit board, each of said second jumper contacts is electrically connected to one of said second cable contacts, each of said first jumper contacts of each of said jumper sockets is electrically connected to every other said first jumper contact of the same said jumper socket, each of said third jumper contacts of each of said jumper sockets is electrically connected to every other said third jumper contact of the same said jumper socket, said first input contact of each of said input connectors is electrically connected to said first jumper contacts of one of said jumper sockets, and said second input contact of the same said input connector is electrically connected to said third jumper contacts of the same said jumper socket;

providing means to connect said first jumper contacts of each said jumper socket to one of said second jumper contacts of the same said jumper socket;

providing means to connect said third jumper contacts of each said jumper socket to one of said second jumper contacts of the same said jumper socket;

providing means to connect each of said second cable contacts to one of said first cable contacts;

inserting an integrated circuit module having a first surface and a second surface in said integrated circuit socket wherein said second surface of said integrated circuit module is directly over said center opening of said integrated circuit socket and said display opening of said first circuit board;

electrically connecting said electrical signal sources to said first input contacts and said second input contacts of said input connectors; and visually observing said first surface and said second surface of said integrated circuit module.

12. The method of claim 11 wherein said fourth number is between about 4 and 8.

13. The method of claim 11 wherein said fifth number, said seventh number, and said ninth number are between about 20 and 60.

14. The method of claim 11 wherein said sixth number and said eighth number are between about 5 and 9.

15. The method of claim 11 wherein said first number is between about 68 and 280.

16. The method of claim 11 wherein said means to connect each of said second cable contacts to one of said first cable contacts comprises a ribbon cable having a first end, a second end, a first cable connector at said first end, and a second cable connector at said second end.

17. The method of claim 11 wherein said first circuit board is a multilevel circuit board having a plurality of wiring levels.

18. The method of claim 11 wherein said second circuit board is a multilevel circuit board having a plurality of wiring levels.

19. The method of claim 11 wherein said means to connect said first jumper contacts of each said jumper socket to one of said second jumper contacts of the same said jumper socket and said means to connect said third jumper contacts of each said jumper socket to one of said second jumper contacts of the same said jumper socket comprises a jumper cable having a first end, a second end, a first jumper connector at said first end, and a second jumper connector at said second end.

* * * * *

UNITED STATES PATENT AND TRADEMARK OFFICE
CERTIFICATE OF CORRECTION

PATENT NO. : 5,838,162
DATED : Nov. 17, 1998
INVENTOR(S) : Wen-Szu Chung and Wei-Kay Chiu It is certified that error appears in the above-identified patent and that said Letters Patent is hereby corrected as shown below:

On the title page, at (75), delete "Pao-Shan-Hriang"

and replace with --Hsin-Chu--.

Signed and Sealed this

Sixteenth Day of March, 1999

Attest:

Attesting Officer

Q. TODD DICKINSON

Acting Commissioner of Patents and Trademarks